(12) United States Patent
Masuda et al.

(10) Patent No.: US 8,847,707 B2
(45) Date of Patent: Sep. 30, 2014

(54) FILTER

(75) Inventors: Hiroshi Masuda, Nagaokakyo (JP); Takahiro Mori, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/420,740

(22) Filed: Mar. 15, 2012

(65) Prior Publication Data

US 2012/0169434 A1    Jul. 5, 2012

Related U.S. Application Data

(63) Continuation of application No. PCT/JP2010/063283, filed on Aug. 5, 2010.

(30) Foreign Application Priority Data

Sep. 18, 2009    (JP) ................... 2009-216845

(51) Int. Cl.
*H03H 7/09* (2006.01)
*H03H 7/01* (2006.01)
*H03H 1/00* (2006.01)
*H03H 7/075* (2006.01)

(52) U.S. Cl.
CPC ..... *H03H 7/1775* (2013.01); *H03H 2001/0085* (2013.01); *H03H 7/0115* (2013.01); *H03H 7/1708* (2013.01); *H03H 7/075* (2013.01)
USPC .......................................... 333/185; 333/175

(58) Field of Classification Search
CPC ...... H03H 7/0115; H03H 7/1766; H03H 7/09
USPC .................................. 333/185, 175, 204, 205
See application file for complete search history.

(56) References Cited

U.S. PATENT DOCUMENTS

2007/0241839 A1*   10/2007   Taniguchi ................ 333/185

FOREIGN PATENT DOCUMENTS

| EP | 2 009 787 A1 | 12/2008 |
|---|---|---|
| JP | 9-307389 A | 11/1997 |
| JP | 2000-201001 A | 7/2000 |
| JP | 2006-033614 A | 2/2006 |
| JP | 2007-325047 A | 12/2007 |
| WO | 2007/119356 A1 | 10/2007 |

OTHER PUBLICATIONS

Official Communication issued in International Patent Application No. PCT/JP2010/063283, mailed on Nov. 2, 2010.

* cited by examiner

*Primary Examiner* — Benny Lee
*Assistant Examiner* — Gerald Stevens
(74) *Attorney, Agent, or Firm* — Keating & Bennett, LLP

(57) ABSTRACT

A filter includes a multilayer body including a plurality of insulator layers stacked on top of one another. Outer electrodes are provided on surfaces of the multilayer body. A first resonator is connected to a first one of the outer electrodes and includes a first coil. A second resonator is connected to a second one of the outer electrodes and includes a second coil. A third resonator includes a third coil that is magnetically coupled with the first and second coils. The first and second coils are respectively defined by coil conductor layers provided on an insulator layer. The third coil is defined by via hole conductors that penetrate through the insulator layer in a z-axis direction.

8 Claims, 6 Drawing Sheets

FILTER

BACKGROUND OF THE INVENTION

1. Field of the Invention

The present invention relates to filters and more specifically relates to multilayer LC filters.

2. Description of the Related Art

A multilayer dielectric filter described in Japanese Unexamined Patent Application Publication No. 2006-33614 is an example of a known conventional filter. Hereafter, the multilayer dielectric filter described in Japanese Unexamined Patent Application Publication No. 2006-33614 will be described with reference to the drawings. FIG. 6 is an exploded perspective view of a multilayer dielectric filter 500.

The multilayer dielectric filter 500 includes a multilayer body 502 and outer electrodes 503 (503a to 503d). The multilayer body 502 has a rectangular parallelepiped shape and is formed by stacking rectangular insulator layers 504 (504a to 504j) on top of one another. The outer electrodes 503 are respectively provided on the four side surfaces of the multilayer body 502. The outer electrode 503a is a high-frequency signal input terminal. The outer electrode 503b is a high-frequency signal output terminal. The outer electrodes 503c and 503d are ground terminals.

In addition, resonators 505 (505a to 505c) are built into the multilayer dielectric filter 500. The resonators 505a to 505c respectively include resonance electrodes 506a to 506c. The resonance electrodes 506a to 506c are provided on the insulator layer 504f and function as coils. The resonance electrode 506a is connected to the outer electrodes 503a and 503c. The resonance electrode 506b is connected to the outer electrode 503c. The resonance electrode 506c is connected to the outer electrodes 503b and 503c. The resonance electrode 506b is magnetically coupled with the resonance electrodes 506a and 506c. In addition to the resonance electrodes 506, the resonators 505a to 505c also include capacitors, but description of such capacitors will be omitted here.

Furthermore, the multilayer dielectric filter 500 includes an adjustment electrode 508. The adjustment electrode 508 is partially superposed with the resonance electrodes 506a and 506c and not superposed with the resonance electrode 506b when viewed in plan from the stacking direction.

In the thus-configured multilayer dielectric filter 500, a high-frequency signal is input from the outer electrode 503a and is output from the outer electrode 503b. The resonance electrode 506a and the resonance electrode 506b are magnetically coupled with each other, and therefore a high-frequency signal input from the outer electrode 503a is transmitted to the resonance electrode 506b via electromagnetic induction. Furthermore, the resonance electrode 506b and the resonance electrode 506c are magnetically coupled with each other, and therefore the high-frequency signal is transmitted to the resonance electrode 506c via electromagnetic induction. Then, the high-frequency signal, which has been transmitted through the resonance electrode 506c, is output from the outer electrode 503b. Here, the resonance electrodes 506a to 506c form the resonators 505a to 505c. Consequently, portions of the high-frequency signal outside the pass frequency band are removed during transmission through the resonance electrodes 506a to 506c. Therefore, a high-frequency signal of the pass frequency band is output from the outer electrode 503b.

In addition, as illustrated in FIG. 6, the multilayer dielectric filter 500 is provided with the adjustment electrode 508. The low-frequency side of the pass frequency band of the multilayer dielectric filter 500 can be sharply attenuated using this electrode.

However, there is a problem in that, if it is attempted to narrow the pass frequency band, the size of the multilayer dielectric filter 500 is increased. In more detail, in order to narrow the pass frequency band of the multilayer dielectric filter 500, it is sufficient to weaken the magnetic coupling between the resonance electrodes 506a to 506c. However, in order to weaken the magnetic coupling between the resonance electrodes 506a to 506c, it is necessary to increase the distance between the resonance electrodes 506a to 506c. As a result, the multilayer dielectric filter 500 is increased in size.

SUMMARY OF THE INVENTION

Accordingly, preferred embodiments of the present invention provide a filter that can narrow the pass frequency band without being increased in size.

A filter according to a first preferred embodiment of the present invention includes a multilayer body including a plurality of insulator layers stacked on top of one another, an input electrode and an output electrode each provided on a surface of the multilayer body, a first resonator that is connected to the input electrode and includes a first coil, a second resonator that is connected to the output electrode and includes a second coil, and a third resonator that includes a third coil that is magnetically coupled with the first coil and/or the second coil. The first coil and the second coil respectively are defined by a first coil conductor layer and a second coil conductor layer provided on an insulator layer. The third coil includes a via hole conductor that penetrates through an insulator layer in a stacking direction.

A filter according to a second preferred embodiment of the present invention includes a multilayer body including a plurality of insulator layers stacked on top of one another, an input electrode and an output electrode each provided on a surface of the multilayer body; a first resonator that is connected to the input electrode and includes a first coil, a second resonator that is connected to the output electrode and includes a second coil, and a third resonator that includes a third coil that is magnetically coupled with the first coil and/or the second coil. The first coil and the second coil are respectively defined by a first via hole conductor and a second via hole conductor that penetrate through an insulator layer in a stacking direction. The third coil includes a third coil conductor layer that is provided on an insulator layer.

According to various preferred embodiments of the present invention, a pass frequency band can be narrowed without increasing the size of a filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, a filter according to preferred embodiments of the present invention will be described.

Figure 1:
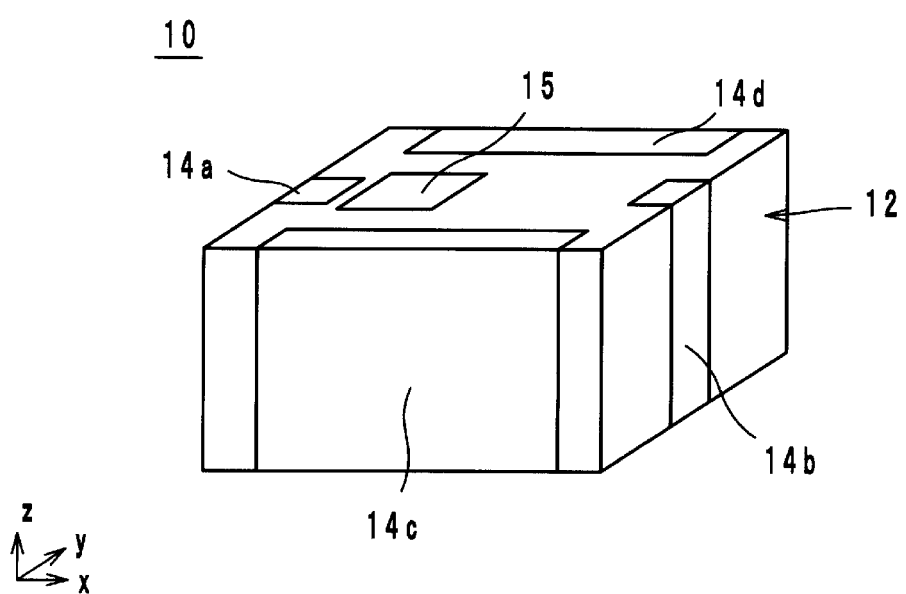
FIG. 1 is an external perspective view of a filter according to a preferred embodiment of the present invention.
Figure 2:
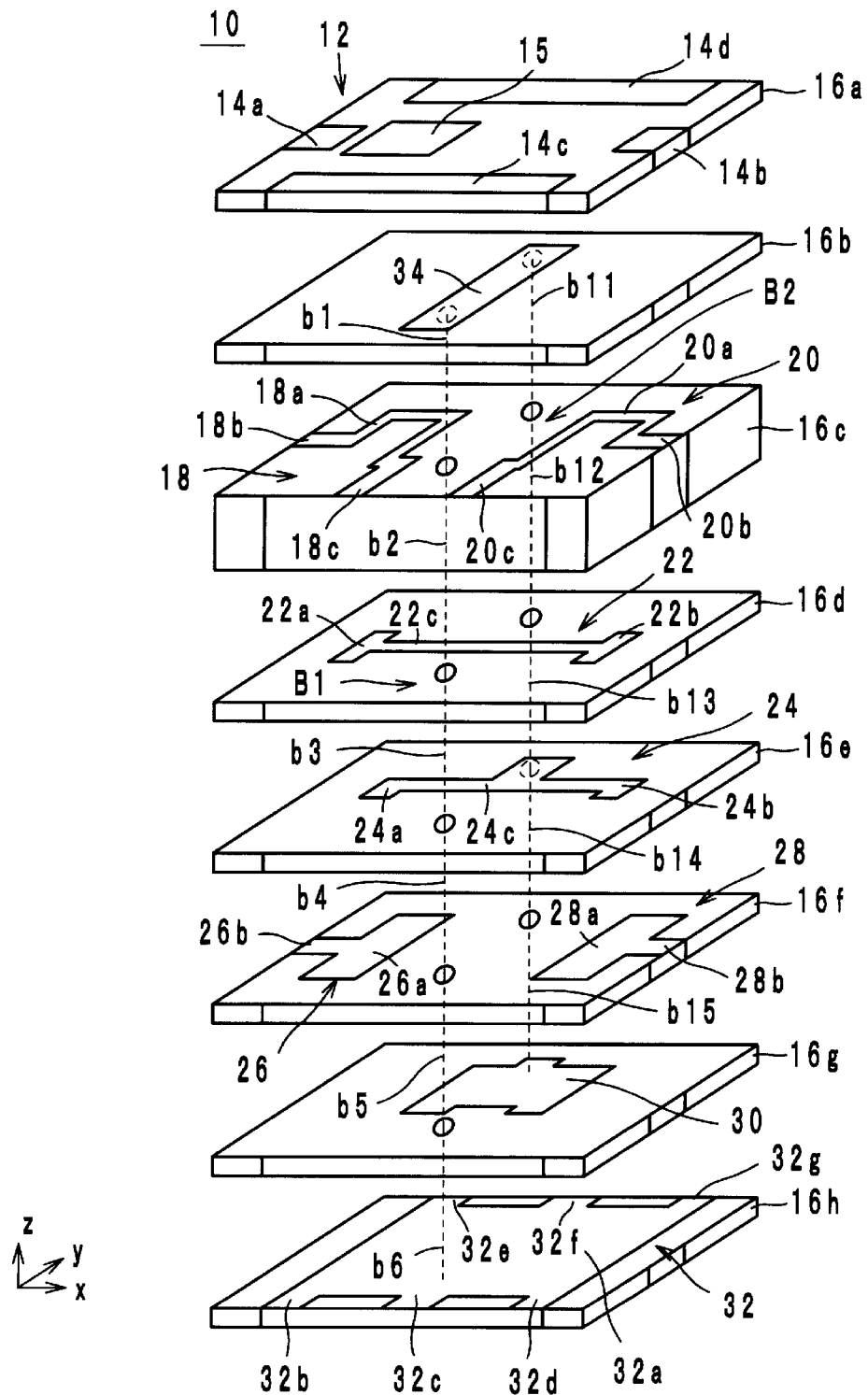
FIG. 2 is an exploded perspective view of the filter of FIG. 1.
Figure 3:
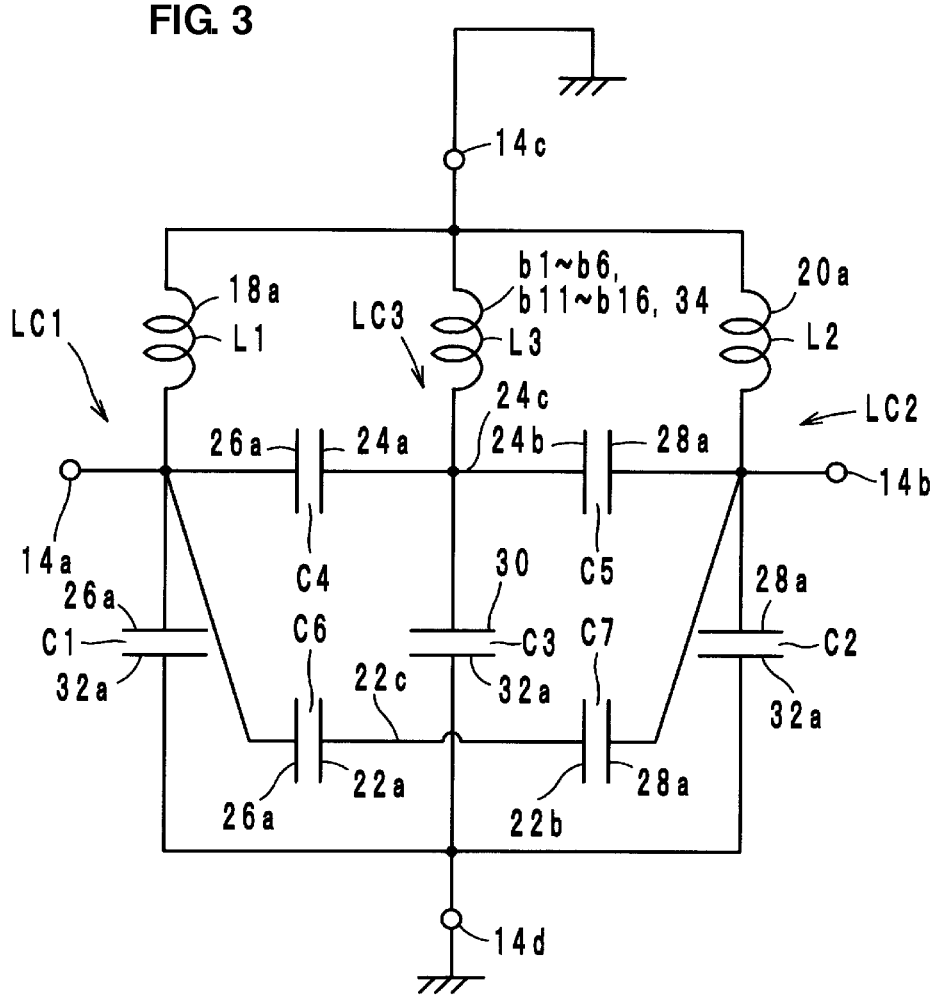
FIG. 3 is an equivalent circuit diagram of the filter of FIG. 1.

FIG. 1 is an external perspective view of a filter 10 according to a preferred embodiment of the present invention. FIG. 2 is an exploded perspective view of the filter 10. FIG. 3 is an equivalent circuit diagram of the filter 10. A z-axis direction indicates the stacking direction in FIG. 1 and FIG. 2. In addition, an x-axis direction indicates a direction parallel to long sides of the filter 10 when viewed in plan from the z-axis direction. A y-axis direction indicates a direction parallel to short sides of the filter 10 when viewed in plan from the z-axis direction. The origin of the x axis, the y axis and the z axis is the center of the filter 10.

As illustrated in FIG. 1 and FIG. 2, the filter 10 includes a multilayer body 12, outer electrodes 14 (14a to 14d), a direction recognition mark 15, resonators LC1 to LC3 and capacitors C4 to C7. As illustrated in FIG. 2, the multilayer body 12 preferably includes insulator layers 16 (16a to 16h) stacked on top of one another and has a rectangular or substantially rectangular parallelepiped shape, for example. In addition, the resonators LC1 to LC3 are built into the multilayer body 12.

As illustrated in FIG. 1, the outer electrode 14a is provided on a side surface of the multilayer body 12 on the negative side in the x-axis direction and is preferably used as a high-frequency signal input electrode. The outer electrode 14b is provided on a side surface of the multilayer body 12 on the positive side in the x-axis direction and is preferably used as a high-frequency signal output electrode. The outer electrode 14c is provided on a side surface of the multilayer body 12 on the negative side in the y-axis direction and is preferably used as a ground electrode. The outer electrode 14d is provided on a side surface of the multilayer body 12 on the positive side in the y-axis direction and is preferably used as a ground electrode.

The direction recognition mark 15 is provided on an upper surface of the multilayer body 12 on the positive side in the z-axis direction and is used to identify orientations of the input electrode and the output electrode of the filter 10 at the time of mounting.

As illustrated in FIG. 2, the insulator layers 16 preferably have a rectangular or substantially rectangular shape and, for example, are formed of a ceramic dielectric. The insulator layers 16a to 16h are stacked on top of one another in this order from the positive side to the negative side in the z-axis direction.

As illustrated in FIG. 2 and FIG. 3, the resonator LC1 includes a coil L1 and a capacitor C1 and is connected between the outer electrode 14a and the outer electrodes 14c and 14d. Specifically, the coil L1 and the capacitor C1 are connected in parallel between the outer electrode 14a and the outer electrodes 14c and 14d.

As illustrated in FIG. 2, the coil L1 includes a coil conductor layer 18. The coil conductor layer 18 includes a coil portion 18a and lead out portions 18b and 18c and is provided on the insulator layer 16c. The coil portion 18a is a line-shaped conductor that turns from the outer electrode 14a toward the outer electrode 14c while looping in the clockwise direction on the insulator layer 16c (xy plane) when viewed in plan from the z-axis direction. In addition, the coil portion 18a includes a portion that extends in the y-axis direction. Furthermore, the lead out portion 18b is connected to one end of the coil portion 18a and is in contact with the short edge of the insulator layer 16c on the negative side in the x-axis direction. Thus, the coil conductor layer 18 is connected to the outer electrode 14a. Similarly, the lead out portion 18c is connected to the other end of the coil portion 18a and is in contact with the long edge of the insulator layer 16c on the negative side in the y-axis direction. Thus, the coil conductor layer 18 is connected to the outer electrode 14c.

The capacitor C1 includes a capacitor conductor layer and a ground conductor layer 32. The capacitor conductor layer 26 includes a capacitor portion 26a and a lead out portion 26b and is provided on the insulator layer 16f. The capacitor portion 26a preferably is a rectangular or substantially rectangular conductor provided on the insulator layer 16f. The lead out portion 26b is connected to the capacitor portion 26a and is in contact with the short edge of the insulator layer 16f on the negative side in the x-axis direction. Thus, the capacitor conductor layer 26 is connected to the outer electrode 14a. In addition, the ground conductor layer 32 includes a ground portion 32a and lead out portions 32b to 32g and is provided on the insulator layer 16h. The ground portion 32a preferably is a rectangular or substantially rectangular conductor that is arranged so as to cover substantially the entire surface of the insulator layer 16h. Thus, the capacitor conductor layer 26 and the ground conductor layer 32 oppose each other with the insulator layers 16f and 16g interposed therebetween and thereby the capacitor C1 is formed. The lead out portions 32b to 32d are connected to the ground portion 32a and are in contact with the long edge of the insulator layer 16h on the negative side in the y-axis direction. The lead out portions 32e to 32g are connected to the ground portion 32a and are in contact with the long edge of the insulator layer 16h on the positive side in the y-axis direction. Thus, the ground conductor layer 32 is connected to the outer electrodes 14c and 14d. As described above, the capacitor C1 is connected between the outer electrode 14a and the outer electrodes 14c and 14d.

As illustrated in FIG. 2 and FIG. 3, a resonator LC2 includes a coil L2 and a capacitor C2 and is connected between the outer electrode 14b and the outer electrodes 14c and 14d. Specifically, the coil L2 and the capacitor C2 are connected in parallel between the outer electrode 14b and the outer electrodes 14c and 14d.

As illustrated in FIG. 2, the coil L2 includes a coil conductor layer 20. The coil conductor layer 20 includes a coil portion 20a and lead out portions 20b and 20c and is provided on the insulator layer 16c. The coil portion 20a is a line-shaped conductor that turns from the outer electrode 14b toward the outer electrode 14c while looping in the counter-clockwise direction on the insulator layer 16c (xy plane) when viewed in plan from the z-axis direction. In addition, the coil portion 20a includes a portion that extends in the y-axis direction. Furthermore, the lead out portion 20b is connected to one end of the coil portion 20a and is in contact with the short edge of the insulator layer 16c on the positive side in the x-axis direction. Thus, the coil conductor layer 20 is connected to the outer electrode 14b. Similarly, the lead out portion 20c is connected to the other end of the coil portion 20a and is in contact with the long edge of the insulator layer 16c on the negative side in the y-axis direction. Thus, the coil conductor layer 20 is connected to the outer electrode 14c.

The capacitor C2 includes a capacitor conductor layer 28 and the ground conductor layer 32. The capacitor conductor layer 28 includes a capacitor portion 28a and a lead out portion 28b and is provided on the insulator layer 16f. The capacitor portion 28a preferably is a rectangular or substantially rectangular conductor that is provided on the insulator layer 16f on the positive side of the capacitor portion 26a in the x-axis direction. The lead out portion 28b is connected to the capacitor portion 28a and is in contact with the short edge of the insulator layer 16f on the positive side in the x-axis direction. Thus, the capacitor conductor layer 28 is connected to the outer electrode 14b. Regarding the details of the ground conductor layer 32, a general description thereof has already been made and therefore further description will be omitted. Thus, the capacitor conductor layer 28 and the ground conductor layer 32 oppose each other with the insulator layers 16f and 16g interposed therebetween, and thereby the capacitor C2 is formed. The capacitor C2 is connected between the outer electrode 14b and the outer electrodes 14c and 14d.

Here, as illustrated in FIG. 2, the area of the ground conductor layer 32 is larger than the sum of the area of the capacitor conductor layer 26 and the area of the capacitor conductor layer 28. In addition, the capacitor conductor layers 26 and 28 are provided between the ground conductor layer 32 and the coil conductor layers 18 and 20 in the z-axis direction.

As illustrated in FIG. 2 and FIG. 3, the resonator LC3 includes a coil L3 and a capacitor C3 and is connected between the outer electrodes 14c and 14d. Furthermore, as illustrated in FIG. 2, the resonator LC3 is interposed between the resonator LC1 and the resonator LC2 in the x-axis direction when viewed in plan in the z-axis direction.

As illustrated in FIG. 2, the coil L3 includes via hole conductors B1 and B2 and a connection conductor layer 34, and is magnetically coupled with the coils L1 and L2. The via hole conductor B1 linearly extends in the z-axis direction between the coil conductor layers 18 and 20 in the x-axis direction when viewed in plan in the z-axis direction. The via hole conductor B1 includes via hole conductors b1 to b6 and penetrates through the insulator layers 16b to 16g in the z-axis direction. The via hole conductor B2 extends linearly in the z-axis direction on the positive side of the via hole conductor B1 in the y-axis direction and between the coil conductor layers 18 and 20 in the x-axis direction when viewed in plan from the z-axis direction. The via hole conductor B2 includes via hole conductors b11 to b15 and penetrates through the insulator layers 16b to 16f in the z-axis direction. The connection conductor layer 34 is provided on the insulator layer 16b, which is different from the insulator layer 16c on which the coil conductor layers 18 and 20 are provided, so as to be located between the coil conductor layers 18 and 20 in the x-axis direction and connects end portions of the via hole conductors B1 and B2 on the positive side in the z-axis direction to each other. The connection conductor layer 34 is a line-shaped conductor that extends in the y-axis direction and extends parallel to a portion of the coil portion 18a that extends in the y-axis direction and extends parallel or substantially parallel to a portion of the coil portion 20a that extends in the y-axis direction, when viewed in plan in the z-axis direction.

The capacitor C3 includes a capacitor conductor layer 30 and the ground conductor layer 32. The capacitor conductor layer 30 preferably is a rectangular or substantially rectangular conductor that is provided on the insulator layer 16g, which is different from the insulator layer 16f on which the capacitor conductor layers 26 and 28 are provided, and is superposed with the via hole conductor B2 when viewed in plan from the z-axis direction. Therefore, the capacitor conductor layer 30 is connected to an end portion of the via hole conductor b15 of the via hole conductor B2 on the negative side in the z-axis direction. The ground conductor layer 32 is superposed with the via hole conductor B1 when viewed in plan from the z-axis direction. Therefore, the ground conductor layer 32 is connected to an end portion of the via hole conductor b6 of the via hole conductor B1 on the negative side in the z-axis direction. Thus, the capacitor conductor layer 30 and the ground conductor layer 32 oppose each other with the insulator layer 16g interposed therebetween and thereby the capacitor C3 is formed. With the above-described configuration, an end of the coil L3 and the capacitor conductor layer 30 are connected to each other and the other end of the coil L3 and the ground conductor layer 32 are connected to the outer electrodes 14c and 14d.

The capacitors C4 and C5 include a coupling conductor layer 24 and the capacitor conductor layers 26 and 28 and are connected in series between the outer electrodes 14a and 14b. The coupling conductor layer 24 includes capacitor portions 24a and 24b and a connection portion 24c and is provided on the insulator layer 16e. The capacitor portion 24a preferably is a rectangular or substantially rectangular conductor. The capacitor portion 24a opposes the capacitor portion 26a of the capacitor conductor layer 26 and as a result is capacitively coupled with the capacitor portion 26a, whereby the capacitor C4 is formed. The capacitor portion 24b preferably is a rectangular or substantially rectangular conductor that is provided on the insulator layer 16e on the positive side of the capacitor portion 24a in the x-axis direction. The capacitor portion 24b opposes the capacitor portion 28a of the capacitor conductor layer 28 and as a result is capacitively coupled with the capacitor portion 28a, whereby the capacitor C5 is formed. A general description of the capacitor conductor layers 26 and 28 has already been made and therefore further description will be omitted. The connection portion 24c extends in the x-axis direction on the insulator layer 16e and connects the capacitor portions 24a and 24b to each other. In addition, the connection portion 24c is connected to the via hole conductor B2. With the above-described configuration, the capacitors C4 and C5 are connected in series with each other between the outer electrodes 14a and 14b. Furthermore, the capacitors C4 and C5 are connected between the coil L3 and the capacitor C3.

In addition, the capacitor conductor layer 26, as well as a defining portion of the capacitor C1, also defines a portion of the capacitor C4. Thus, as illustrated in FIG. 3, the capacitor C4 is connected between the coil L1 and the capacitor C1. Similarly, the capacitor conductor layer 28, as well as defining portion of the capacitor C2, also defines a portion of the capacitor C5. Thus, as illustrated in FIG. 3, the capacitor C5 is connected between the coil L2 and the capacitor C2.

The capacitors C6 and C7 include a coupling conductor layer 22 and the capacitor conductor layers 26 and 28 and are connected in series between the outer electrodes 14a and 14b. The coupling conductor layer 22 includes capacitor portions 22a and 22b and a connection portion 22c and is provided on the insulator layer 16d. The coupling conductor layer 22 is capacitively coupled with the resonator LC1 and the resonator LC2 but is negligibly capacitively coupled with the resonator LC3. Specifically, the capacitor portion 22a preferably is a rectangular or substantially rectangular conductor provided on the insulator layer 16d. The capacitor portion 22a opposes the capacitor electrode 26a and as a result is capacitively coupled with the capacitor electrode 26a, whereby the capacitor C6 is formed. The capacitor portion 22b preferably is a rectangular or substantially rectangular conductor that is provided on the insulator layer 16d on the positive side of the capacitor portion 22a in the x-axis direction. The capacitor portion 22b opposes the capacitor electrode 28a and as a result is capacitively coupled with the capacitor electrode 28a, whereby the capacitor C7 is formed. The connection portion 22c extends in the x-axis direction on the insulator layer 16d and connects the capacitor portions 22a and 22b to each other. Here, the capacitor conductor layers 26 and 28 are respectively connected to the outer electrodes 14a and 14b. Therefore, the capacitors C6 and C7 are connected in series with each other between the outer electrodes 14a and 14b.

In the thus-configured filter 10, the coil L1 and the coil L2 are magnetically coupled with each other and the coil L2 and the coil L3 are magnetically coupled with each other. Thus, the filter 10 defines a band pass filter that allows only signals within a predetermined frequency band to pass therethrough.

Hereafter, an example of operation of the filter 10 will be described with reference to FIGS. 1 to 3. In the filter 10, as illustrated in FIG. 2 and FIG. 3, one end of the coil L1 is connected to the outer electrode 14a, which serves as an input electrode, and the other end of the coil L1 is connected to the outer electrode 14c, which serves as a ground electrode. Thus, a high-frequency signal is transmitted from the outer electrode 14a to the outer electrode 14c through the coil L1. In FIG. 2, a high-frequency signal is transmitted in the clockwise direction through the coil conductor layer 18, when viewed in plan from the z-axis direction.

The coil L1 and the coil L3 are magnetically coupled with each other. Specifically, a portion of the coil portion 18a that extends in the y-axis direction and the connection conductor layer 34 are magnetically coupled with each other. Thus, a high-frequency signal is transmitted from the coil L1 to the coil L3.

In addition, the coil L3 and the coil L2 are magnetically coupled with each other. Specifically, a portion of the coil portion 20a that extends in the y-axis direction and the connection conductor layer 34 are magnetically coupled with each other. Thus, a high-frequency signal is transmitted from the coil L3 to the coil L2. When a high-frequency signal passes through the resonators LC1 to LC3, the portions of the signal that are outside of the predetermined pass frequency band are removed from the high-frequency signal. As a result, an output signal, which is obtained by removing portions of a signal that are outside of the predetermined pass frequency band, is output from the outer electrode 14b.

Figure 6:
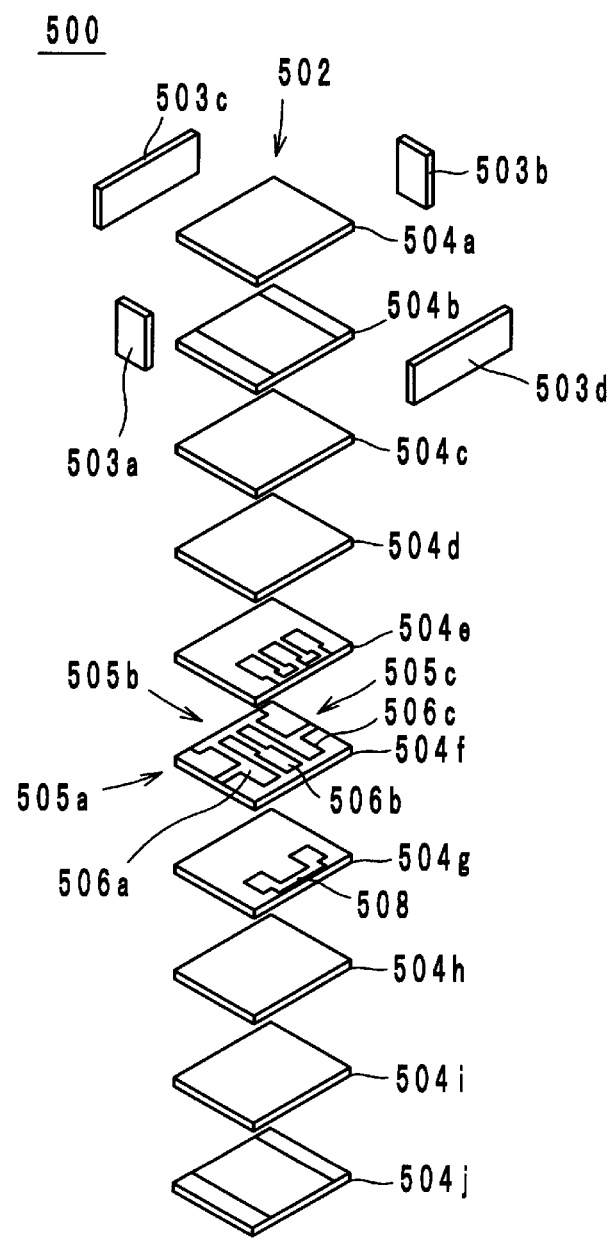
FIG. 6 is an exploded perspective view of a prior art multilayer dielectric filter described in Japanese Unexamined Patent Application Publication No. 2006-33614.

The thus-configured filter 10 can narrow the pass frequency band while not being increased in size. In more detail, when the frequency band of the multilayer dielectric filter 500 illustrated in FIG. 6 is to be narrowed, it is sufficient to weaken the magnetic coupling between the resonance electrodes 506a to 506c. However, in order to weaken the magnetic coupling between the resonance electrodes 506a to 506c, it is necessary to increase the distance between the resonance electrodes 506a to 506c. As a result, the multilayer dielectric filter 500 is increased in size.

Accordingly, in the filter 10, the coil L3 includes the via hole conductors B1 and B2. Since the via hole conductors B1 and B2 extend in the z-axis direction, when a high-frequency signal is transmitted through the via hole conductors B1 and B2, magnetic flux is generated that circulates within the xy plane around the via hole conductors B1 and B2. On the other hand, the coils L1 and L2 respectively include the coil conductor layers 18 and 20, which loop within the xy plane. When a high-frequency signal is transmitted through these coil conductor layers 18 and 20, magnetic flux is generated that circulates within a plane that is perpendicular or substantially perpendicular to the xy plane. Therefore, magnetic flux generated by the via hole conductors B1 and B2 and magnetic flux generated by the coil conductor layers 18 and 20 circulate within planes that are perpendicular or substantially perpendicular to each other. Consequently, it is not likely that the via hole conductors B1 and B2 and the coil conductor layers 18 and 20 will become strongly magnetically coupled with each other. From the above, even when the resonators LC1 to LC3 are close to one another, the coils L1 to L3 are not strongly magnetically coupled with each other, and therefore the band can be narrowed without increasing the size of the filter 10.

In addition, the pass frequency band can be narrowed without increasing the size of the filter 10 due to the following reason. In more detail, the coil L1 and the coil L3 are magnetically coupled with each other mainly between a portion of the coil portion 18a that extends in the y-axis direction and the connection conductor layer 34. Similarly, the coil L2 and the coil L3 are magnetically coupled with each other mainly between a portion of the coil portion 20a that extends in the y-axis direction and the connection conductor layer 34. The coil conductor layers 18 and 20, and the connection conductor layer 34 are provided on different insulator layers 16. Therefore, the coil conductor layers 18 and 20 and the connection conductor layer 34 are weakly magnetically coupled with each other compared with the case in which the coil conductor layers 18 and 20 and the connection conductor layer 34 are provided on the same insulator layer 16. As a result, even when the resonators LC1 to LC3 are close to one another, the coils L1 to L3 are not strongly magnetically coupled with each other, and therefore the band can be narrowed without increasing the size of the filter 10.

Furthermore, in the filter 10, as will be described below, it is easy to adjust the strength of magnetic coupling between the coils L1 and L2, and the coil L3. The coil conductor layers 18 and 20 and the connection conductor layer 34 are provided on different insulator layers 16. Therefore, by, for example, varying the thickness of the insulator layer 16 on which the coil conductor layers 18 and 20 or the connection conductor layer 34 is provided or varying the number of stacked insulator layers 16, the strength of the magnetic coupling between the coil conductor layers 18 and 20, and the connection conductor layer 34 can be adjusted by adjusting the distance between the coil conductor layers 18 and 20, and the connection conductor layer 34.

In addition, in the filter 10, as will be described below, insertion loss can be reduced without increasing the size of the filter 10. In more detail, in a so-called multistage filter including a plurality of resonators, since electric power is more concentrated in a resonator in a central stage, the insertion loss of the filter can be made small by making a no load Q of the resonator of the central stage large. For example, in the filter 10, the no load Q of the resonator LC3 of the central stage may be made large by making the direct current resistance value of the coil L3 small. Then, in the filter 10, the coil L3 includes the via hole conductors B1 and B2. It is easier to reduce the direct current resistance values of the via hole conductors B1 and B2 than to reduce that of a conductor layer. In more detail, since the z-axis direction thickness of a conductor layer is very small, when attempting to secure a sufficient cross sectional area, a large line width becomes necessary. In contrast, since the via hole conductors B1 and B2 have a circular cross section, it is easier to secure a large cross sectional area than in the case of a conductor layer. Therefore, it is easier to make the resistance values of the via hole conductors B1 and B2 small than to make the resistance value of a conductor layer small. As described above, with the filter 10, insertion loss can be made small without increasing the size of the filter 10.

In addition, in the filter 10, the coupling conductor layer 24 allows the resonator LC1 and the resonator LC3 to be capacitively coupled with each other and allows the resonator LC2 and the resonator LC3 to be capacitively coupled with each other. Thus, balance can be achieved between magnetic coupling and capacitive coupling of the coil portion 18a of the resonator LC1 and the connection conductor layer 34 of the resonator LC3, and balance can be achieved between magnetic coupling and capacitive coupling of the coil portion 20a of the resonator LC2 and the connection conductor layer 34 of the resonator LC3. As a result, the coupling between the resonators LC1 to LC3 can be adjusted and the degree of freedom in designing the filter 10 can be improved.

In addition, in the filter 10, the resonator LC1 and the resonator LC2 are capacitively coupled with each other via the coupling conductor layer 22. In a multistage filter equipped with a plurality of resonators, it is known that, if an input-stage resonator and an output-stage resonator are coupled with each other, an attenuation pole can be formed at one side or at both sides of the pass band of the filter. The attenuation characteristics of the filter 10 can be improved by adopting the above-described configuration of the present preferred embodiment. In addition, desired attenuation characteristics can be easily obtained by changing the degree of coupling due to capacitance by changing the thickness of the insulator layer 16d.

Furthermore, in the filter 10, the capacitor conductor layers 26 and 28, and the capacitor conductor layer 30 are provided on different insulator layers 16. Thus, it becomes unlikely that the capacitor conductor layers 26 and 28, and 30 will be close to one another. As a result, in the filter 10, compared with the case in which the capacitor conductor layers 26, 28 and 30 are provided on the same insulator layer 16, there is a greater degree of freedom in designing the size, the shape, the position and the like of the capacitor conductor layers 26, 28 and 30.

In addition, in the filter 10, as will be described below, the insertion loss can be reduced. In more detail, when a high-frequency signal is transmitted through the coil conductor layers 18 and 20, magnetic flux is generated around the coil conductor layers 18 and 20. When this magnetic flux passes through the capacitor conductor layers 26 and 28 and the ground conductor layer 32, eddy currents are generated in the capacitor conductor layers 26 and 28 and the ground conductor layer 32. The generation of eddy currents causes the insertion loss of the filter 10 to increase. Therefore, it is desirable to suppress and prevent the generation of eddy currents. Here, the area of the ground conductor layer 32 preferably is larger than the sum of the areas of the capacitor conductor layers 26 and 28. Therefore, in the case where the ground conductor layer 32 and the capacitor conductor layers 26 and 28 are positioned at the same distance from the coil conductor layers 18 and 20, the eddy currents generated in the ground conductor layer 32 preferably are larger than the eddy currents generated in the capacitor conductor layers 26 and 28. Consequently, in the filter 10, the generation of eddy currents is suppressed and prevented by spacing the ground conductor layer 32 further away from the coil conductor layers 18 and 20 than the capacitor conductor layers 26 and 28 are. As a result, insertion loss of the filter 10 can be reduced.

In addition, the coil L3 includes the via hole conductors B1 and B2 and the connection conduction layer 34. Here, since a current flows through the via hole conductors B1 and B2 in the z-axis direction, magnetic flux is generated around the via hole conductors B1 and B2 within the xy plane, which is perpendicular or substantially perpendicular to the z-axis direction. Consequently, the magnetic flux generated around the via hole conductors B1 and B2 does not intersect with the ground conductor layer 32. Accordingly, the no load Q of the resonator LC3 can be made high and the loss of the filter 10 can be reduced without eddy currents being generated. In addition, the coil L3 preferably has an inverted U shape, for example. In this way, the coil L3 has a bent structure, and as a result the length of the coil L3 can be increased and the inductance value of the coil L3 can be increased without increasing the height of the filter 10 in the z-axis direction.

Next, a method of manufacturing the filter 10 will be described while referring to FIG. 1 and FIG. 2.

First, ceramic green sheets that will become the insulator layers 16 are prepared. Next, the via hole conductors b1 to b6 and b11 to b15 are respectively formed in the ceramic green sheets that will become the insulator layers 16b to 16g. Specifically, via holes are formed by irradiating the ceramic green sheets that will become the insulator layers 16b to 16g with a laser beam. Next, these via holes are filled with a conductive paste composed of, for example, Ag, Pd, Cu or Au or an alloy of any of these metals by using a method such as print coating.

Next, the outer electrodes 14, the direction recognition mark 15, the coil conductor layers 18 and 20, the coupling conductor layers 22 and 24, the capacitor conductor layers 26, 28 and 30, the ground conductor layer 32 and the connection conductor layer 34 are formed by applying a conductive paste having a main component of for example Ag, Pd, Cu or Au or an alloy of any of these metals onto the ceramic green sheets that will become the insulator layers 16a to 16h by using a method such as a screen printing method or a photolithography method. The via holes may be filled with conductive paste at the time when the coil conductor layers 18 and 20 and so forth are formed.

Next, the ceramic green sheets are stacked on top of one another. Specifically, the ceramic green sheet that will become the insulator layer 16h is arranged. Next, the ceramic green sheet that will become the insulator layer 16g is arranged on the ceramic green sheet that will become the insulator layer 16h. After that, the ceramic green sheet that will become the insulator layer 16g is press bonded to the ceramic green sheet that will become the insulator layer 16f. After that, the ceramic green sheets that will become the insulator layers 16e, 16d, 16c, 16b and 16a are similarly stacked in this order and press bonded. A mother multilayer body is formed through the above-described process. The mother multilayer body is subjected to permanent press bonding by using, for example, a hydrostatic press.

Next, the mother multilayer body is cut into multilayer bodies 12 of predetermined dimensions by using a cutting blade. Each of the yet-to-be-fired multilayer bodies 12 is subjected to a de-binder treatment and is then fired.

A fired multilayer body 12 is obtained through the above-described process. The multilayer body 12 is subjected to chamfering by performing barrel processing. Then, silver electrodes that will become the outer electrodes 14 are formed by applying an electrode paste having silver as a main component to the surfaces of the multilayer body 12 by, for example, using a dipping method and then performing baking.

Finally, the outer electrodes 14 are formed by performing Ni plating or Sn plating on the surfaces of the silver electrodes. The filter 10 illustrated in FIG. 1 is completed through the above-described processes.

Figure 4:
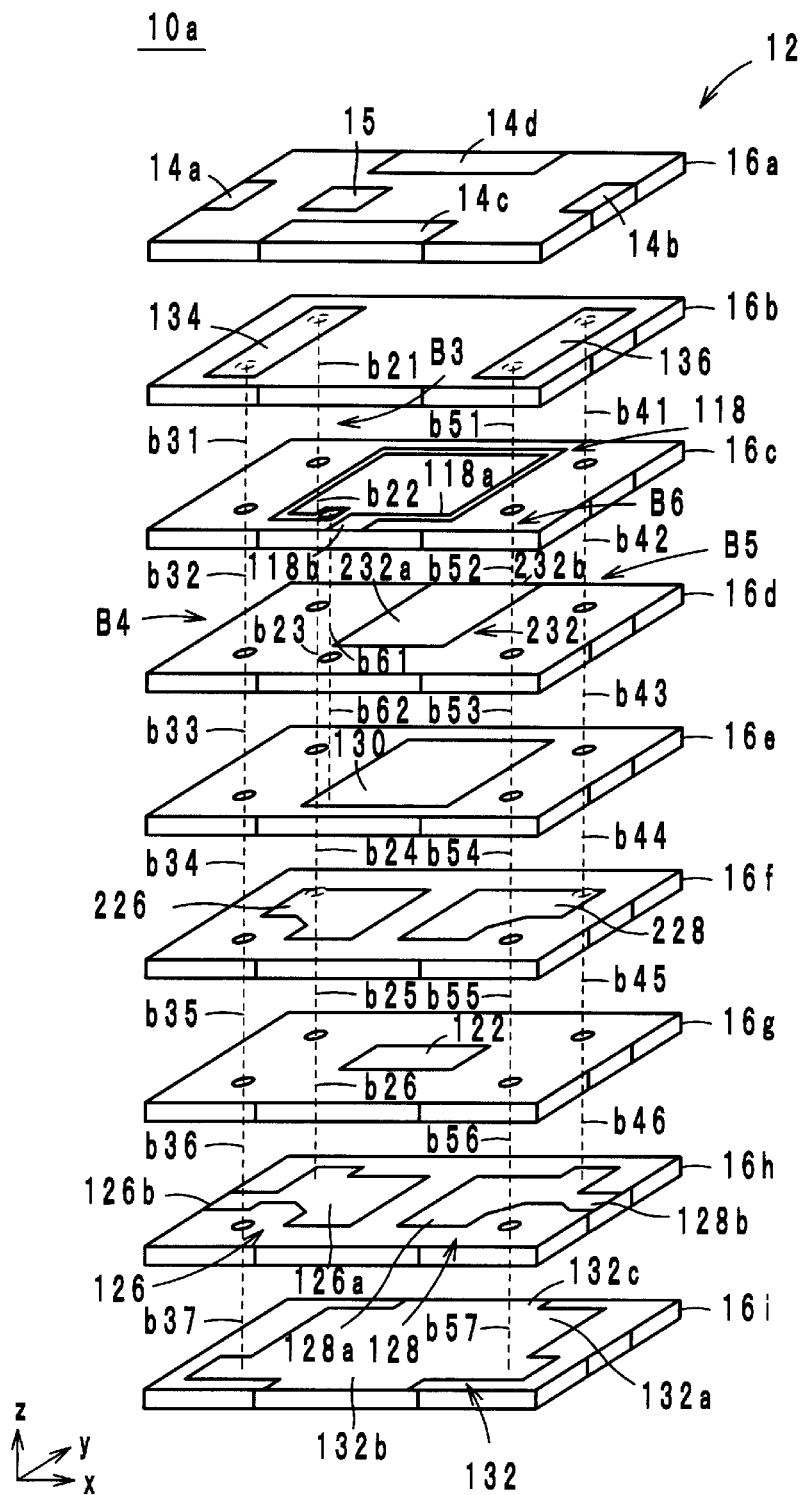
FIG. 4 is an exploded perspective view of a filter according to a modification of a preferred embodiment of the present invention.
Figure 5:
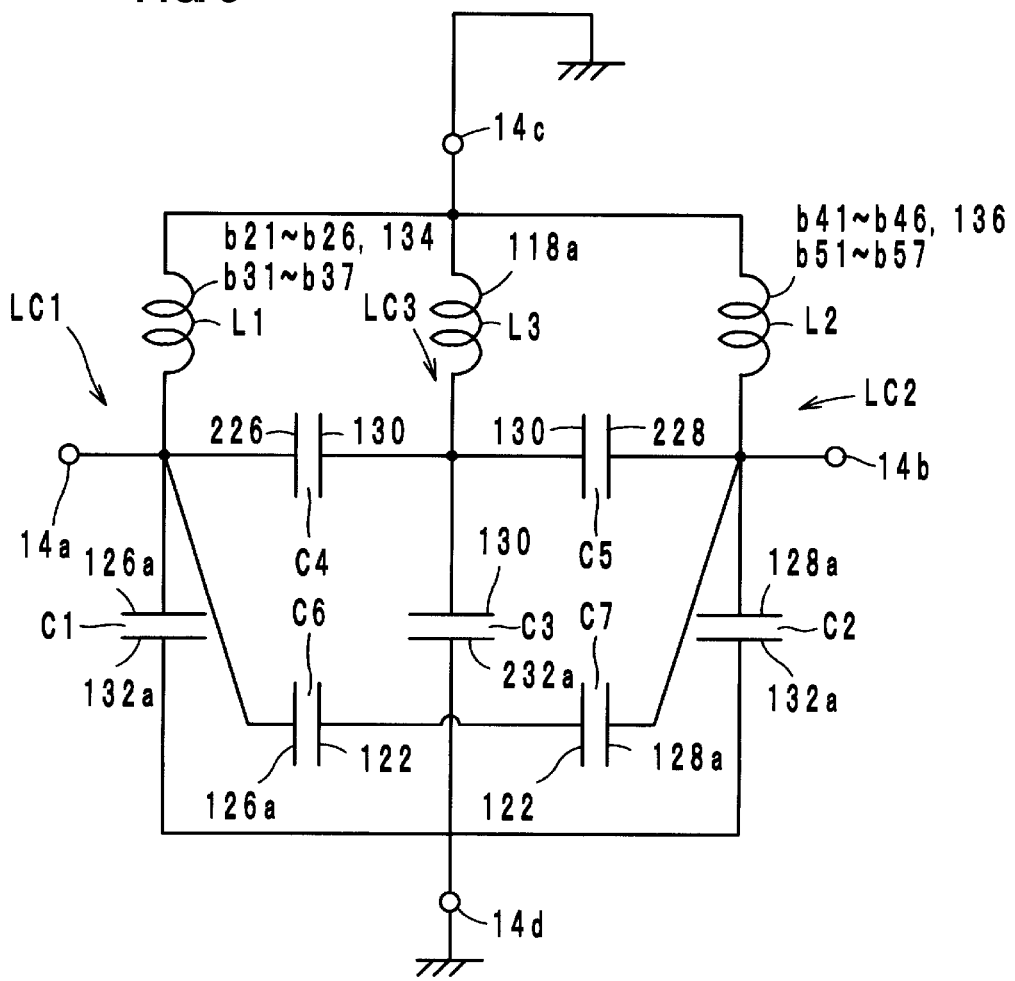
FIG. 5 is an equivalent circuit diagram of a filter according to a modification of a preferred embodiment of the present invention.

In the filter 10, the coils L1 and L2 are preferably defined by the coil conductor layers 18 and 20 and the coil L3 is preferably defined by the connection conductor layer 34 and the via hole conductors B1 and B2. However, the coils L1 and L2 may be defined by via hole conductors and the coil L3 may be defined by a coil conductor layer, for example. Hereafter, a filter 10a according to a modification will be described while referring to the drawings. FIG. 4 is an exploded perspective view of the filter 10a according to the modification. FIG. 5 is an equivalent circuit diagram of the filter 10a according to the modification. As illustrated in FIG. 3 and FIG. 5, the equivalent circuit diagram of the filter 10 and the equivalent circuit diagram of the filter 10a are the same. FIG. 1 is adopted as an external perspective view of the filter 10a. In addition, components of the filter 10a that are the same as those of the filter 10 are denoted by the same reference symbols.

As illustrated in FIG. 4 and FIG. 5, the filter 10a includes the multilayer body 12, the outer electrodes 14 (14a to 14d), the direction recognition mark 15, resonators LC1 to LC3 and capacitors C4 to C7. As illustrated in FIG. 4, the multilayer body 12 is preferably formed by stacking insulator layers 16 (16a to 16i) on top of one another and has a rectangular parallelepiped shape. In addition, the resonators LC1 to LC3 are built into the multilayer body 12.

The configurations of the outer electrodes 14a to 14d and the direction recognition mark 15 of the filter 10a are the same as those of the filter 10, and therefore repetitive description thereof will be omitted.

As illustrated in FIG. 4, the insulator layers 16 preferably have a rectangular or substantially rectangular shape and, for example, are formed of a ceramic dielectric. The insulator layers 16a to 16i are stacked on top of one another in this order from the positive side to the negative side in the z-axis direction.

As illustrated in FIG. 4 and FIG. 5, the resonator LC1 includes a coil L1 and a capacitor C1 and is connected between the outer electrode 14a and the outer electrodes 14c and 14d. Specifically, the coil L1 and the capacitor C1 are connected in parallel between the outer electrode 14a and the outer electrodes 14c and 14d.

As illustrated in FIG. 4, the coil L1 includes via hole conductors B3 and B4 and a connection conductor layer 134. The via hole conductor B3 includes via hole conductors b21 to b26 and penetrates through the insulator layers 16b to 16g in the z-axis direction. The via hole conductor B4 includes via hole conductors b31 to b37 and penetrates through the insulator layers 16b to 16h in the z-axis direction. The connection conductor layer 134 is provided on the insulator layer 16b so as to extend in the y-axis direction and connects end portions the via hole conductors B3 and B4 on the positive side in the z-axis direction.

The capacitor C1 includes a capacitor conductor layer 126 and a ground conductor layer 132. The capacitor conductor layer 126 includes a capacitor portion 126a and a lead out portion 126b and is provided on the insulator layer 16h. The capacitor portion 126a preferably is a rectangular or substantially rectangular conductor provided on the insulator layer 16h. The lead out portion 126b is connected to the capacitor portion 126a and is in contact with the short edge of the insulator layer 16h on the negative side in the x-axis direction. Thus, the capacitor conductor layer 126 is connected to the outer electrode 14a. In addition, the ground conductor layer 132 includes a ground portion 132a and lead out portions 132b and 132c and is provided on the insulator layer 16i. The ground portion 132a preferably is a rectangular or substantially rectangular conductor that is arranged so as to cover substantially the entire surface of the insulator layer 16i. Thus, the capacitor conductor layer 126 and the ground conductor layer 132 oppose each other with the insulator layer 16h interposed therebetween and thereby the capacitor C1 is formed. The lead out portion 132b is connected to the ground portion 132a and is in contact with the long edge of the insulator layer 16i on the negative side in the y-axis direction. The lead out portion 132c is connected to the ground portion 132a and is in contact with the long edge of the insulator layer 16i on the positive side in the y-axis direction. Thus, the ground conductor layer 132 is connected to the outer electrodes 14c and 14d. As described above, the capacitor C1 is connected to the outer electrode 14a and the outer electrodes 14c and 14d.

As illustrated in FIG. 4 and FIG. 5, the resonator LC2 includes a coil L2 and a capacitor C2 and is connected between the outer electrode 14b and the outer electrodes 14c and 14d. Specifically, the coil L2 and the capacitor C2 are connected in parallel between the outer electrode 14a and the outer electrodes 14c and 14d.

As illustrated in FIG. 4, the coil L2 includes via hole conductors B5 and B6 and a connection conductor layer 136. The via hole conductor B5 is formed of via hole conductors b41 to b46 and penetrates through the insulator layers 16b to 16g in the z-axis direction. The via hole conductor B6 includes via hole conductors b51 to b57 and penetrates through the insulator layers 16b to 16h in the z-axis direction. The connection conductor layer 136 is arranged on the insulator layer 16b so as to extend in the y-axis direction and connects end portions the via hole conductors B5 and B6 on the positive side in the z-axis direction.

The capacitor C2 includes a capacitor conductor layer 128 and the ground conductor layer 132. The capacitor conductor layer 128 includes a capacitor portion 128a and a lead out portion 128b and is provided on the insulator layer 16h. The capacitor portion 128a preferably is a rectangular or substantially rectangular conductor provided on the insulator layer 16h. Thus, the capacitor conductor layer 128 and the ground conductor layer 132 oppose each other with the insulator layer 16h interposed therebetween and thereby the capacitor C2 is formed. The lead out portion 128b is connected to the capacitor portion 128a and is in contact with the short edge of the insulator layer 16h on the positive side in the x-axis direction. Thus, the capacitor conductor layer 128 is connected to the outer electrode 14b. As described above, the capacitor C2 is connected between the outer electrode 14b and the outer electrodes 14c and 14d.

As illustrated in FIG. 4 and FIG. 5, the resonator LC3 includes a coil L3 and a capacitor C3 and is connected to the outer electrodes 14c and 14d. Furthermore, as illustrated in FIG. 4, the resonator LC3 is interposed between the resonator LC1 and the resonator LC2 in the x-axis direction when viewed in plan from the z-axis direction.

As illustrated in FIG. 4, the coil L3 includes a coil conductor layer 118 and via hole conductors b61 and b62 and is magnetically coupled with the coils L1 and L2. The coil conductor layer 118 is provided between the via hole conductors B3 and B4 and the connection conductor layer 134, and the via hole conductors B5 and B6 and the connection conductor layer 136 in the x-axis direction on the insulator layer 16c when viewed in plan from the z-axis direction. The coil conductor layer 118 includes a coil portion 118a and a lead out portion 118b.

The coil portion 118a is a line-shaped conductor that loops in the counter-clockwise direction with a point in the vicinity of the outer electrode 14c serving as an origin on the insulator layer 16c (xy plane) when viewed in plan from the z-axis direction. In addition, the coil portion 118a includes portions that extend in the y-axis direction. That is, the coil portion 118a includes portions that are parallel or substantially parallel to the connection conductor layers 134 and 136. Furthermore, the lead out portion 118b is connected to an end of the coil portion 118a and is in contact with the long edge of the insulator layer 16c on the negative side in the y-axis direction. Thus, the coil conductor layer 118 is connected to the outer electrode 14c.

The via hole conductors b61 and b62 penetrate through the insulator layers 16c and 16d in the z-axis direction and form a single via hole conductor as a result of being connected to each other. An end portion of the via hole conductor b61 on the positive side in the z-axis direction is connected the other end of the coil portion 118a.

The capacitor C3 includes a capacitor conductor layer 130 and a ground conductor layer 232. The capacitor conductor layer 130 preferably is a rectangular or substantially rectangular conductor that is provided on the insulator layer 16e and is superposed with the via hole conductors b61 and b62 when viewed in plan from the z-axis direction. Therefore, the capacitor conductor layer 130 is connected to an end portion of the via hole conductor b62 on the negative side in the z-axis direction. The ground conductor layer 232 includes a ground portion 232a and a lead out portion 232b and is provided on the insulator layer 16d. The ground portion 232a is superposed with the capacitor conductor layer 130 when viewed in plan from the z-axis direction. Thus, the capacitor conductor layer 130 and the ground conductor layer 232 oppose each other with the insulator layer 16d interposed therebetween and thereby the capacitor C3 is formed. Furthermore, the lead out portion 232b is connected to the ground portion 232a and is in contact with the long edge of the insulator layer 16d on the positive side in the y-axis direction. Thus, the ground conductor layer 232 is connected to the outer electrode 14d. With the above-described configuration, an end of the coil L3 and the capacitor conductor layer 130 are connected to each other and the other end of the coil L3 and the ground conductor layer 232 are connected to the outer electrode 14d.

The capacitors C4 and C5 include capacitor conductor layers 130, 226 and 228 and are connected in series between the outer electrodes 14a and 14b. The capacitor conductor layers 226 and 228 preferably are rectangular or substantially rectangular conductor layers provided on the insulator layer 16f and oppose and as a result are capacitively coupled with the capacitor conductor layer 130, whereby the capacitors C4 and C5 are formed. In addition, the capacitor conductor layers 226 and 228 are respectively connected to the via hole conductors B3 and B5. With the above-described configuration, the capacitors C4 and C5 are connected in series with each other between the outer electrodes 14a and 14b. Furthermore, the capacitors C4 and C5 are connected between the coil L3 and the capacitor C3 via the capacitor conductor layer 130.

The capacitors C6 and C7 include a coupling conductor layer 122 and the capacitor conductor layers 126, 226, 128 and 228 and are connected in series with each other between the outer electrodes 14a and 14b. The coupling conductor layer 122 preferably is a rectangular or substantially rectangular conductor layer provided on the insulator layer 16g. The coupling conductor layer 122 is capacitively coupled with the resonator LC1 and the resonator LC2 but is negligibly coupled with the resonator LC3. Specifically, the coupling conductor layer 122 opposes the capacitor electrode 126a and the capacitor electrode 226 and as a result is capacitively coupled with the capacitor electrode 126a and the capacitor electrode 226, and thereby the capacitor C6 is formed. In addition, the coupling conductor layer 122 opposes the capacitor electrode 128a and the capacitor electrode 228 and as a result is capacitively coupled with the capacitor electrode 128a and the capacitor electrode 228, and thereby the capacitor C7 is formed. Here, the capacitor conductor layers 126 and 128 are respectively connected to the outer electrodes 14a and 14b. Therefore, the capacitors C6 and C7 are connected in series with each other between the outer electrodes 14a and 14b.

In the thus-configured filter 10a, the coil L1 and the coil L2 are magnetically coupled with each other and the coil L2 and the coil L3 are magnetically coupled with each other. Thus, the filter 10a defines a band pass filter that allows only signals within a predetermined frequency band to pass therethrough.

Similarly to the filter 10a, a pass frequency band can be narrowed without an increase in size in the thus-configured filter 10a.

In the filter 10, the ground conductor layer 32 is preferably defined by a single conductor layer, for example. However, the ground conductor layer 32 may be, for example, divided into a portion that opposes the capacitor conductor layer 26, a portion that opposes the capacitor conductor layer 28 and a portion that opposes the capacitor conductor layer 30.

In addition, the connection conductor layer 34 preferably connects end portions of the via hole conductors B1 and B2 that are on the positive side in the z-axis direction. However, the connection conductor layer 34 may instead connect end portions of the via hole conductors B1 and B2 that are on the negative side in the z-axis direction. In this case, the capacitor conductor layer 30 and the ground conductor layer 32 would be positioned on the positive side of the via hole conductors B1 and B2 in the z-axis direction. Furthermore, the filter 10 may additionally include a plurality of resonators defined by connection conductor layers and via hole conductors.

In the filter 10a, the coil L3 preferably is magnetically coupled with both of the coils L1 and L2. However, it is sufficient that the coil L3 be magnetically coupled with at least one of the coils L1 and L2.

Various preferred embodiments of the present invention are of use in filters and are particularly excellent in that a pass frequency band can be narrowed without increasing the size of the filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
a multilayer body including a plurality of insulator layers stacked on top of one another in a stacking direction;
an input electrode and an output electrode each provided on a surface of the multilayer body;
a first resonator that is connected to the input electrode and includes a first coil;
a second resonator that is connected to the output electrode and includes a second coil; and
a third resonator that includes a third coil that is magnetically coupled with at least one of the first coil and the second coil; wherein
the first coil and the second coil respectively include a first coil conductor layer and a second coil conductor layer provided on a surface of an insulator layer of the plurality of insulator layers;
the third coil includes at least one via hole conductor that penetrates through the insulator layer in the stacking direction and a connection conductor layer provided on a surface of one of the plurality of insulator layers and connected to the at least one via hole conductor, the third coil including at least one turn;

each of the first coil conductor layer and the second coil conductor layer provided on the surface of the insulator layer has a partial loop shape including a plurality of turns;
an axis about which the plurality of turns of the first coil conductor layer turn and an axis about which the plurality of turns of the second coil conductor layer turn extend in the stacking direction and an axis about which the at least one turn of the third coil turns extends in a direction perpendicular or substantially perpendicular to the stacking direction; and
no portion of the first coil and no portion of the second coil are provided on the surface of the one of the plurality of insulator layers on which the connection conductor layer is provided.

2. The filter according to claim 1, wherein the at least one via hole conductor of the third coil includes two via hole conductors that penetrate through the insulator layer in the stacking direction and the connection conductor layer connects upper ends or lower ends of the two via hole conductors in the stacking direction to each other.

3. The filter according to claim 2, wherein the first coil conductor layer and the second coil conductor layer each include a portion that extends parallel or substantially parallel to the connection conductor layer when viewed from above in the stacking direction.

4. The filter according to claim 1, further comprising a first coupling conductor layer that is capacitively coupled to the first resonator and the second resonator.

5. The filter according to claim 1, further comprising a ground electrode provided on a surface of the multilayer body, wherein the first resonator further includes a first capacitor including a first capacitor conductor layer and a first ground conductor layer, the second resonator further includes a second capacitor including a second capacitor conductor layer and a second ground conductor layer, the third resonator further includes a third capacitor including a third capacitor conductor layer and a third ground conductor layer, the first coil and the first capacitor are connected in parallel with each other between the input electrode and the ground electrode, the second coil and the second capacitor are connected in parallel with each other between the output electrode and the ground electrode, and an end of the third coil and the third capacitor conductor layer are connected to each other and another end of the third coil and the third ground conductor layer are connected to the ground electrode.

6. The filter according to claim 5, further comprising a second coupling conductor layer that, as well as being connected to the via hole conductor and being capacitively coupled with the first capacitor conductor layer, is capacitively coupled with the second capacitor conductor layer.

7. The filter according to claim 5, wherein the third capacitor conductor layer is provided on one of the plurality of insulator layers that is different from another of the plurality of insulator layers on which the first capacitor conductor layer and the second capacitor conductor layer are provided.

8. The filter according to claim 5, wherein the first ground conductor layer and the second ground conductor layer are defined by a single ground conductor layer, an area of the single ground conductor layer is larger than a sum of an area of the first capacitor conductor layer and an area of the second capacitor conductor layer, and the first capacitor conductor layer and the second capacitor conductor layer are provided between the single ground conductor layer, and the first coil conductor layer and the second coil conductor layer in the stacking direction.

* * * * *